US008637905B2

(12) United States Patent
Zhang

(10) Patent No.: US 8,637,905 B2
(45) Date of Patent: Jan. 28, 2014

(54) SEMICONDUCTOR DEVICE AND FABRICATION METHOD THEREOF

(75) Inventor: Naiqian Zhang, Xi'an (CN)

(73) Assignee: Dynax Semiconductor, Inc., Xi'an, Shaanxi (CN)

( * ) Notice: Subject to any disclaimer, the term of this patent is extended or adjusted under 35 U.S.C. 154(b) by 0 days.

(21) Appl. No.: 13/499,558

(22) PCT Filed: Aug. 18, 2010

(86) PCT No.: PCT/CN2010/076093
§ 371 (c)(1),
(2), (4) Date: Jul. 17, 2012

(87) PCT Pub. No.: WO2011/026393
PCT Pub. Date: Mar. 10, 2011

(65) Prior Publication Data
US 2012/0280280 A1    Nov. 8, 2012

(30) Foreign Application Priority Data

Sep. 7, 2009    (CN) .......................... 2009 1 0172874

(51) Int. Cl.
*H01L 29/66* (2006.01)
*H01L 21/338* (2006.01)

(52) U.S. Cl.
USPC ............ 257/194; 257/E29.246; 257/E21.403; 438/172

(58) Field of Classification Search
USPC .................. 257/194, E29.246, E21.403, 1–5; 438/172
See application file for complete search history.

(56) References Cited

U.S. PATENT DOCUMENTS

| | | | | |
|---|---|---|---|---|
| 5,019,877 A | * | 5/1991 | Hosogi | 257/282 |
| 2001/0004124 A1 | * | 6/2001 | Noda et al. | 257/401 |
| 2002/0135019 A1 | * | 9/2002 | Noda | 257/367 |
| 2005/0184338 A1 | * | 8/2005 | Huang et al. | 257/335 |
| 2008/0274621 A1 | * | 11/2008 | Beach et al. | 438/694 |

* cited by examiner

*Primary Examiner* — Wensing Kuo
*Assistant Examiner* — Moazzam Hossain
(74) *Attorney, Agent, or Firm* — Harness, Dickey & Pierce, P.L.C.

(57) ABSTRACT

The invention relates to a semiconductor device and a fabrication method thereof. A semiconductor device according to an aspect of the invention comprising: a semiconductor layer on a substrate; an isolation layer on the semiconductor layer; a source and a drain which are in contact with the semiconductor layer, each of the source and the drain comprises multiple fingers, and the multiple fingers of the source intersect the multiple fingers of the drain; and a gate on the isolation layer, the gate is located between the source and the drain and comprises a closed ring structure which encircles the multiple fingers of the source and the drain.

19 Claims, 10 Drawing Sheets

SEMICONDUCTOR DEVICE AND FABRICATION METHOD THEREOF

TECHNICAL FIELD

The present invention relates to a group-III nitride semiconductor device and a fabrication method thereof, in particular, to a novel layout design scheme which facilitates to improve breakdown voltage of a group-III nitride semiconductor device while effectively utilizing device space on a wafer and is particularly suitable to high voltage and large current device.

DESCRIPTION OF THE RELATED ART

The dielectric breakdown voltage of third-generation semiconductor Gallium Nitride (GaN) is as high as 3 MV/cm, much higher than that of first-generation semiconductor Silicon (Si) or second-generation semiconductor Gallium Arsenide (GaAs), and thus a GaN electronic device can withstand a very high voltage. Meanwhile, GaN may form a heterojunction structure with other Ga-type compound semiconductor (group-III nitride semiconductor). Since group-III nitride semiconductor has very strong spontaneous and piezoelectric polarization effect, a two-dimensional electron gas (2DEG) channel with a very high concentration of electrons may be formed near the interface of the heterojunction. Such heterojunction structure also effectively reduces ionized impurity scattering, and thus greatly enhances the electron mobility in the channel. A GaN High Electron Mobility Transistor (HEMT) fabricated based on such heterojunction can support high current at high frequency and has a very low turn-on resistance. Those characteristics as described above make GaN HEMT especially suitable as a high frequency and high power radio frequency (RF) device, or as a high voltage and large current switching device.

Since electrons in the two-dimensional electron gas channel have very high mobility, switching rate of GaN HEMT increases significantly as compared to Silicon device. Also, the high-concentration two-dimensional electron gas also offers GaN HEMT a high current density, making it suitable to the needs of large current power device. In addition, GaN HEMT is a wide-bandgap semiconductor and is capable of operation at high temperature. A silicon device in a high power operating environment often needs additional temperature reduction module to guarantee its normal operation. However, temperature reduction module is not necessary or not critical for GaN device. Therefore, GaN power devices facilitate space and cost saving.

A cross-section view of a common GaN HEMT device structure is shown in FIG. 1. Under layer is a substrate 94, and a nucleation layer 95, a buffer layer 96 and an isolation layer 97 are deposited on the substrate 94. A two-dimensional electron gas channel is formed near the interface of the buffer layer and the isolation layer. A layer of dielectric layer 98 is deposited above the isolation layer and may be used to reduce current dispersion under high frequency. A source 91 and a drain 92 are electrically connected to the two-dimensional electron gas channel and may control flow direction of electrons in the channel. A gate 93 is located between the source and the drain and is used to control the number of electrons in the channel, and thus the magnitude of current.

Generally, in a transistor, there is a very high voltage between the gate and the drain and a strong electric field gathers at the space charge region near the gate. When the peak field is larger than the breakdown field of the material, performance of the transistor will be seriously degraded, and even breakdown phenomenon may occur. For a GaN power device, since it often operates in a high voltage (even may exceed a thousand volts) environment, requirement on control of peak field is critical. Many research institutions have proposal various schemes for reducing peak field, which involve a variety of improvements on epi-structure and device structure, for example, utilization of field plate structure and floating gate structure may make distribution of electrical field more uniform. For details of field plate structure, reference may be made to Chinese patent application publication CN101232045A and CN1954440A, hereinafter referred to as patent document 1 and 2 respectively, and the entire content of which are incorporated herein for reference. For details of floating gate structure, reference may be made to Chinese patent application publication CN101320751A, hereinafter referred to as patent document 3, and the entire content of which is incorporated herein for reference.

The present disclosure proposes another scheme to reduce peak field and enhance the breakdown voltage of device from the perspective of layout design. Conventional layout of GaN transistor often uses a linear-type gate and drain structure, as shown in FIG. 2. In FIG. 2, due to the termination of gate 13, variation in electric potential at two terminals 13A of the gate 13 are relatively abrupt and electric line of force is more intensive. Thus, electric field at terminals 13A of the gate 13 are much higher than that of intermediate region of the gate 13, and device breakdown also tends to happen at terminals 13A of the gate 13.

Therefore, there is a need to design a novel layout to effectively reduce electric field at ends of a gate.

SUMMARY OF THE INVENTION

The present invention provides a semiconductor device and a fabrication method thereof to solve the above problems existing in prior art.

According to an aspect of the invention, there is provided a semiconductor device, comprising: a semiconductor layer on a substrate; an isolation layer on the semiconductor layer; a source and a drain which are in contact with the semiconductor layer, each of the source and the drain comprises multiple fingers, and the multiple fingers of the source intersect the multiple fingers of the drain; and a gate on the isolation layer, the gate is located between the source and the drain and comprises a closed ring structure which encircles the multiple fingers of the source and the drain.

With such semiconductor device of the invention, since the source and drain comprise multiple fingers intersected with each other, which is to say, the source and the drain are embedded with each other, and the gate is located between the source and the drain and encircles the multiple fingers of the source and drain, the total gate width within unit area may be significantly increased. Because current density of the device is not affected by layout design, when the total gate width within unit area increases significantly, maximum saturation current within unit area will also increase significantly. Also, since the gate comprises a closed ring structure without beginning and ending, making the gate no starting point and ending point, the phenomenon of point discharge may be effectively avoided, which increases breakdown voltage of the device. In contrast, if the gate has an open ring structure, then at position of gate's starting point and ending point, due to point discharge effect, electric line of force will be too intensive at gate's starting point and ending point, resulting in very strong electric field. In addition, by forming the source and the drain into embedded structure intersected with each other, area on a wafer may be effectively utilized, thereby reducing production cost.

Preferably, head and tail of the gate are directly connected or connected through an interconnection line. More preferably, in case that head and tail of the gate are directly connected, respective corners of the gate employ an arc structure, and portions of the source and the drain that correspond to the respective corners also employ an arc structure. In case that head and tail of the gate are connected through an interconnection line, portions of the drain that correspond to connection portions of the gate and the interconnection line employ an arc structure, respective corners of the gate employ an arc structure, and portions of the source and the drain that correspond to the respective corners also employ an arc structure. More preferably, tips of the multiple fingers of the source and the drain employ an arc structure, and portions of the gate that correspond to the arc structure of the tips of the multiple fingers also employ an arc structure.

By employing an arc structure at respective corners of the gate and also employing an arc structure at source and drain at corresponding positions, variation of gate at corners are very gentle, and are not so abrupt as shape variation of tips at terminals 13A of the above linear-type gate 13. Since shape variation of gate in an arc structure is very gentle without sharp shape variation, the condition of very intensive electric line of force at certain tips will not occur, and thus point discharge due to sharp edge will not occur. Since the distribution of electric field is relatively uniform at these arc corners, and tips at terminal point of linear-type gate do not exist, it also avoids point discharge, effectively reduces electric field at corners of the gate and increases breakdown voltage of the device.

Preferably, in the layout structure of the above semiconductor device, lead pads of the source and the gate are located at one side, and lead pad of the drain is located at the other side.

By making lead pad of the gate and that of the source to be at same side and lead pad of the drain to be at the other side, device damage due to the high voltage between gate and drain may be avoided. This is because there is a very high voltage difference (may be over one thousand volts) between gate and drain, and between source and drain, while the voltage difference between source and gate is relative small. If gate and drain are located at same side, the high voltage between gate and drain may cause device degradation or device breakdown.

Preferably, width of the multiple fingers of the source and the drain are different.

The invention has no limitation on the number and width of fingers of the source and the drain. By making the width of the fingers of the source and the drain to be different, enough space will be left in certain regions within the source and drain to place lead pad of the source and that of the drain, so that there is no need to place lead pad at regions outside of the source and drain, and to lead an interconnection line or an air bridge is from the source and drain connecting the lead pads. Therefore, space on a wafer may be saved and production cost may be reduced.

According to another aspect of the invention, there is provided a method for fabricating a semiconductor device, comprising steps of: depositing a semiconductor layer on a substrate; depositing an isolation layer on the semiconductor layer; forming a source and a drain which are in contact with the semiconductor layer, each of the source and the drain comprises multiple fingers, and the multiple fingers of the source intersect the multiple fingers of the drain; and forming a gate on the isolation layer, the gate is located between the source and the drain and comprises a closed ring structure which encircles the multiple fingers of the source and the drain.

With the above method for fabricating a semiconductor device of the invention, the above same and corresponding advantages may be achieved.

BRIEF DESCRIPTION OF THE DRAWINGS

It is believed that the above features, advantages and objectives of the invention will be better understood through detailed description of embodiments of the invention in conjunction with accompany drawings, in which.

DETAILED DESCRIPTION OF THE PREFERRED EMBODIMENT

Next, a detailed description of the preferred embodiments of the present invention will be given in conjunction with the drawings.

Embodiment 1

Figure 3A:
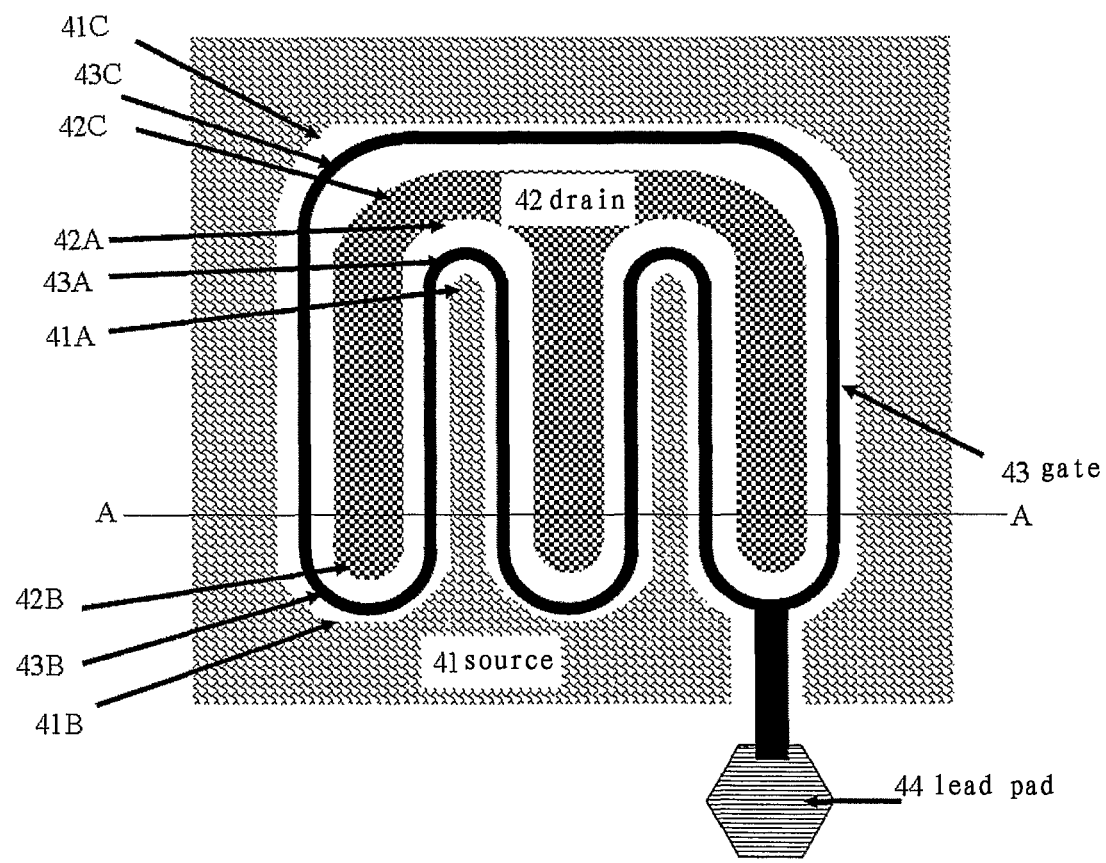
FIG. 3A depicts layout structure of a semiconductor device according to an embodiment of the invention.
Figure 3B:
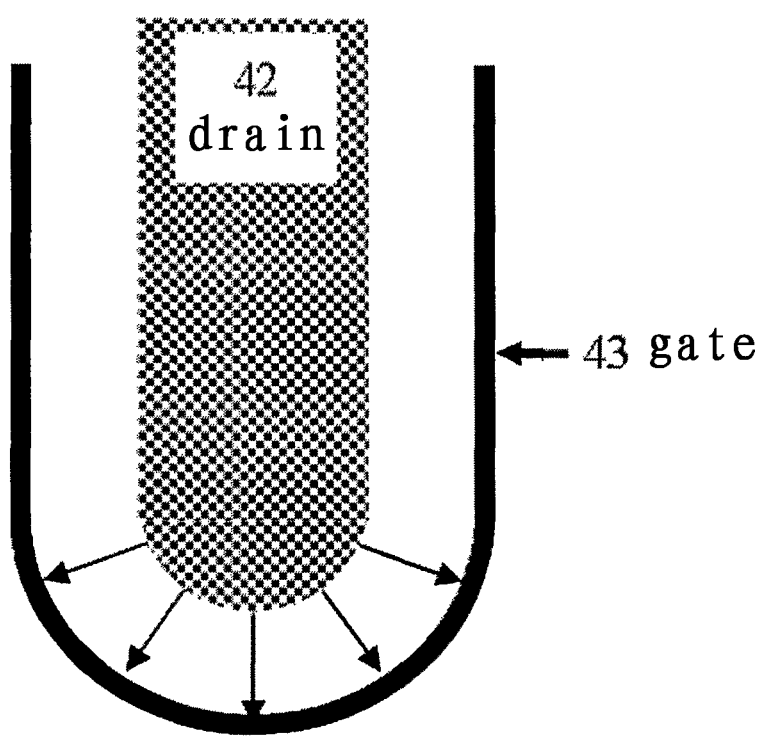
FIG. 3B is an enlarged view of one finger of the drain and the gate at corresponding position in FIG. 3A.
Figure 4:
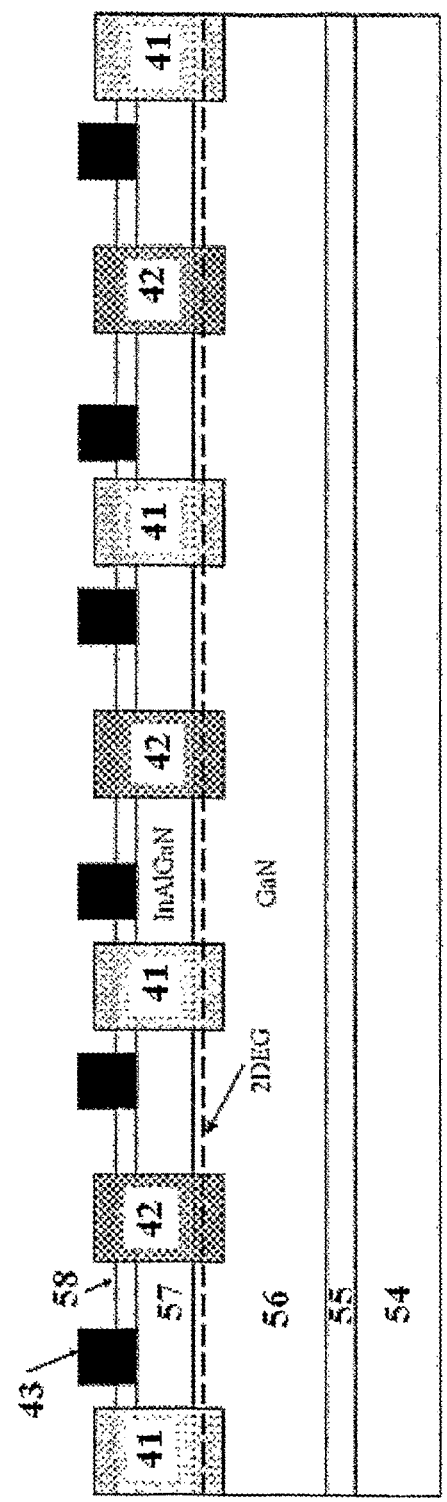
FIG. 4 depicts a cross-section view along line A-A in layout structure of the semiconductor device of FIG. 3A.

FIG. 3A depicts layout structure of a semiconductor device according to the embodiment of the invention, FIG. 3B is an enlarged view of one finger of the drain and the gate at corresponding position in FIG. 3A, and FIG. 4 depicts a cross-section view along line A-A in layout structure of the semiconductor device of FIG. 3A.

Next, basic structure of an enhancement mode GaN HEMT of the embodiment as an example of semiconductor device will first be described with reference to FIG. 4

As shown in FIG. 4, under layer is a substrate 54 for growing GaN material, which generally is Sapphire, SiC, GaN, Si or any other substrates known in the art suitable for growing GaN material, and the invention has no limitation on this.

On the substrate 54 is an optional nucleation layer 55 for growing a semiconductor layer thereon. It should be appreciated that, instead of forming the nucleation layer 55, a semiconductor layer may also be directly formed on the substrate 54.

On the nucleation layer 55 is a semiconductor layer 56, which may be any semiconductor material that is based on nitride, such as group-III nitride semiconductor material, wherein group-III atom comprises Indium, Aluminum, Gallium or combinations thereof. In particular, the semiconductor layer 56 may comprise Gallium Nitride (GaN) and other Ga-type compound semiconductor material such as AlGaN, InGaN etc, or may be a bonded stack of Ga-type compound semiconductor material with other semiconductor material. Polarity of Ga-type semiconductor material may be Ga-face, or may be N-face, non-polarity or semi-polarity.

On the semiconductor layer 56 is an isolation layer 57, which may be any semiconductor material that is capable of forming hetero-junction with underlying semiconductor layer 56, including Ga-type compound semiconductor material or group-III nitride semiconductor material, such as $In_xAl_yGa_zN_{1-x-y-z}$ ($0 \leq x, y, z \leq 1$). That is to say, the invention has no limitation on the semiconductor layer 56 and the isolation layer 57, as long as the two can form heterojunction therebetween. Since semiconductor heterojunction is formed between the semiconductor layer 56 and the isolation layer 57, polarized charge at the interface of the heterojunction introduces two-dimensional electron gas (2DEG) with high electron concentration. Meanwhile, since ionized impurity scattering is greatly reduced, electrons have very high electron mobility.

On the isolation layer is an optional dielectric layer 58, which may be one or more layers of dielectric layer. The dielectric layer 58 may be crystal material deposited during growth or process procedure, such as GaN or AlN etc; or may be amorphous material deposited during growth or process procedure, such as $Si_xN_y$ or $SiO_2$ etc. The dielectric layer 58 may help to reduce current dispersion effect of GaN HEMT.

A source 41 and drain 42 of the semiconductor device form electrical connection with 2DEG in the semiconductor layer 56. In this embodiment, the methods that the source 41 and drain 42 form electrical connection with 2DEG in the semiconductor layer 56 may be, but not limited to, as follows: a. high temperature anneal; b. ion implantation; c heavy doping. In case that high temperature anneal is performed, metal of electrodes of the source 41 and drain 42 penetrates the isolation layer 57 to be in contact with the semiconductor layer 56, so as to form electrical connection with 2DEG in the semiconductor layer 56. In case that ion implantation and heavy doping are performed, the source 41 and drain 42 are comprised of ion implantation portion or heavy doping portion that forms electrical connection with 2DEG in the semiconductor layer 56 and electrodes thereon. It should be appreciated that, the method described herein for forming the source 41 and drain 42 is just for illustration, the invention may form the source 41 and drain 42 through any method known by those skilled in the art.

A gate 43 of the semiconductor device is at a region located between the source 41 and drain 42. The gate 43 may be a metal gate, or may be a two-layer gate structure, for example, the lower layer is an insulating dielectric (such as $SiO_2$), and the upper layer is gate metal. Alternatively, in the semiconductor device of the present embodiment, it may also comprise a field plate structure and a floating gate structure, details of the two structures may be found in the above patent document 1-3, and description of which be omitted herein.

The layout structure of the semiconductor device of the present embodiment will be described in detail below with reference to FIGS. 3A and 3B.

FIG. 3A depicts a top view of the layout structure of the present embodiment. As shown in FIG. 3A, the source 41 comprises multiple fingers 41A leaded from a base portion, the drain 42 also comprises multiple fingers 42B leaded from a base portion, and the multiple fingers 41A of the source 41 intersect with the multiple fingers 42B of the drain 42, that is, in interleaved arrangement. Thus, the source 41 and the drain 42 are embedded with each other.

The gate 43 is located between the source 41 and the drain 42, and forms a closed ring structure encircling the multiple fingers 41A of the source 41 and the multiple fingers 42B of the drain 42. As shown in FIG. 3A, the gate 43 is in a snake-like distribution, head and tail of which are connected without starting and ending. The drain 42 is entirely encircled by the gate 43. The source 41 is located at peripheral of the gate and encircles the gate 43 except for an opening. An interconnection line (such as interconnection metal) is leaded from the gate 43 out of the opening of the source and is connected to a lead pad 44 of the gate. In this embodiment, an opening may also not be formed in the source 41, that is to say, the source 41 may entirely encircle the gate 43. In this case, the gate may be connected to its lead pad 44 through wiring method known by those skilled in the art, such as an air bridge etc.

With the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, the total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

In addition, in the present embodiment, preferably, respective corners of the gate 43 employ an arc structure, and portions of the source 41 and the drain 42 that correspond to the respective corners of the gate 43 also employ an arc structure. More preferably, tips of the multiple fingers 41A of the source 41 and the multiple fingers 42B of the drain 42 employ an arc structure, and portions of the gate 43 that correspond to the arc structure of the tips of the multiple fingers 41A, 42B also employ an arc structure.

Figure 1:
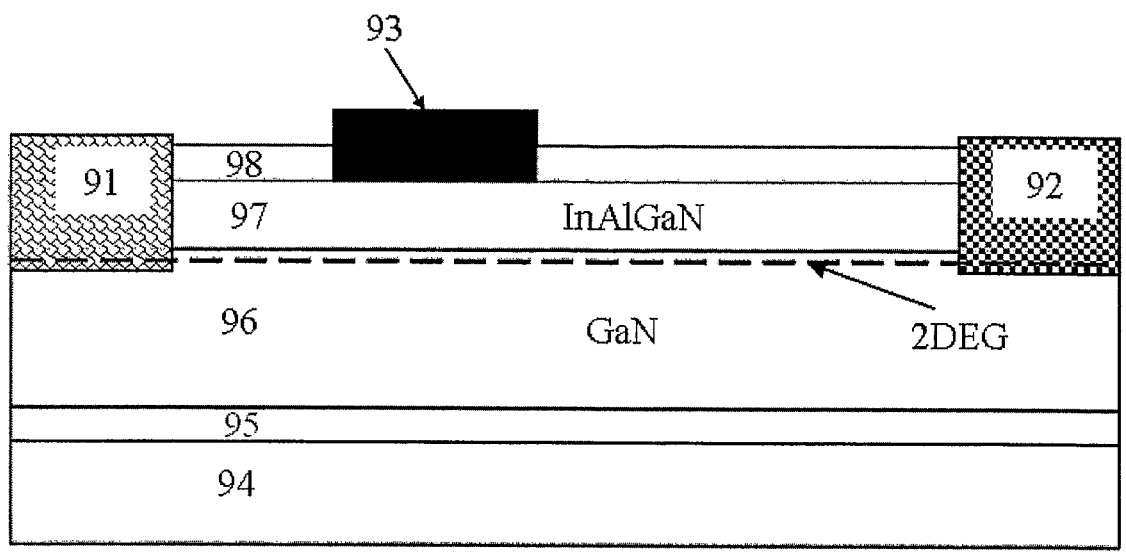
FIG. 1 is a cross-section view of device structure of a conventional GaN HEMT.
Figure 2:
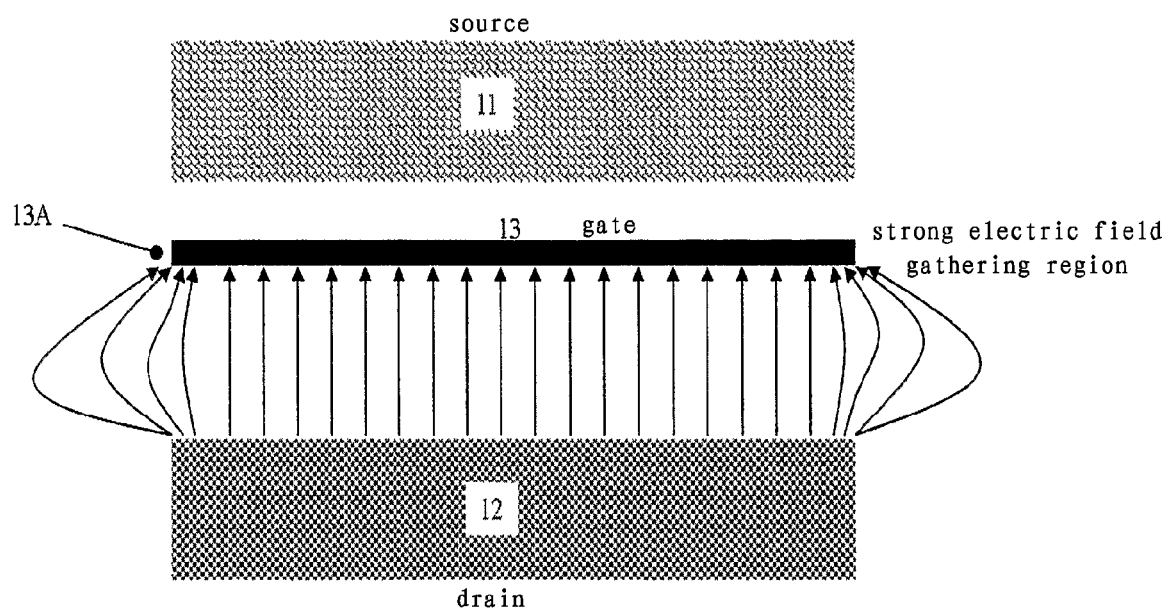
FIG. 2 is a diagram of distribution of electric field in layout structure of a conventional GaN HEMT that employs a linear-type gate.

Specifically, as shown in FIG. 3A, arc design is also employed at corners 43C of the closed ring structure of the gate 43 and at source 41C and drain 42C at corresponding positions. By employing an arc structure at respective corners of the gate and also employing an arc structure at source and drain at corresponding positions, variation of gate at corners are very gentle, and are not so abrupt as shape variation of tips at terminals 13A of the above linear-type gate 13 shown in FIG. 2. Since shape variation of gate in an arc structure is very gentle without sharp shape variation, the condition in which electric line of force are very intensive at certain tips will not occur, and thus point discharge due to sharp edge will not occur. Since distribution of electric field is relatively uniform at these arc corners, tips at terminal point of linear-type gate do not exist, thus also avoiding point discharge, effectively reducing electric field at corners of the gate and increasing breakdown voltage of the device.

Further, an arc structure is employed at tips of the multiple fingers 41A of the source 41, and an arc structure is also employed at portion 42A of the drain and portion 43A of the gate corresponding to tips of the multiple fingers 41A of the source 41. In addition, an arc structure is employed at tips of the multiple fingers 42B of the drain 42, and an arc structure is also employed at portion 41B of the source and portion 43B of the gate corresponding to tips of the multiple fingers 42B of the drain 42. As shown by the enlarged view in FIG. 3B, since tips of the fingers of the drain 42 and corresponding portions of gate 43 employ an arc structure, variation in shape thereof are very gentle, distribution of electric field is relatively uniform in the arc structure, which avoids point discharge and helps to increase breakdown voltage of the device.

It should be appreciated that, although a structure in which the gate 43 entirely encircles the drain 42 is shown in FIG. 3A, it is apparent that the source 41 may be interchanged with the drain 42, thus forming a structure in which the gate 43 entirely encircles the source 41 and the drain 42 is located at peripheral of the gate 43.

Embodiment 2

Figure 5:
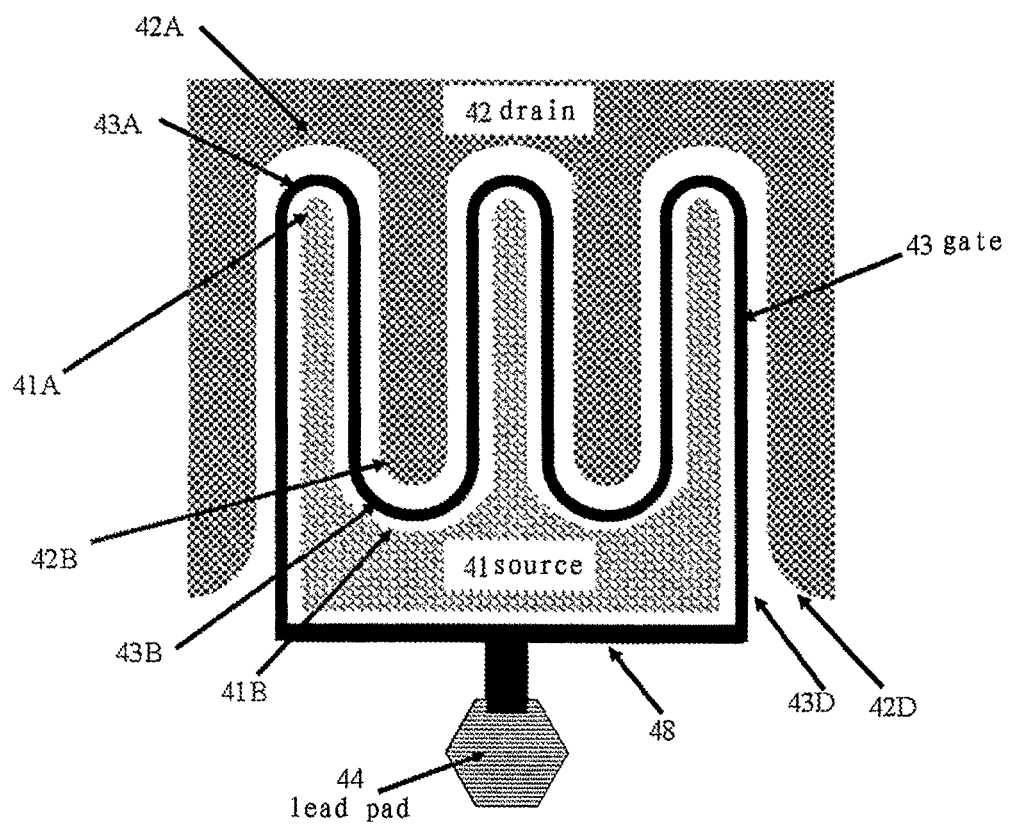
FIG. 5 depicts a layout structure of a semiconductor device according to another embodiment of the invention.

FIG. 5 depicts a layout structure of a semiconductor device according to another embodiment of the invention.

As shown in FIG. 5, this embodiment is the same as the embodiment 1 shown in the above FIG. 3A in that, the source 41 and the drain 42 comprise intersected multiple fingers 41A, 42B, and the gate 43 is located between the source 41 and the drain 42, and forms a closed ring structure encircling the multiple fingers 41A of the source 41 and the multiple fingers 42B of the drain 42. Description of portions of embodiment 2 that are same as that of embodiment 1 will be omitted herein, and emphasis will be put on difference of the two.

Embodiment 2 differs from embodiment 1 in two points. First, the gate 43 with closed ring structure entirely encircles the source 41, and the drain 42 is located at peripheral of the gate 43. Second, starting and ending point of the gate 43 are not directly connected, instead, they are connected through an interconnection line 48, which may be formed by any electric conductive material such as metal, and the invention has no limitation on this.

In this embodiment, a sharp right angle 43D is formed at the corner where the gate 43 is connected to the interconnection line 48, as shown in FIG. 5. To reduce electric field near the right angle 43D, an arc structure is employed at an ending point 42D terminating the drain 42, that is, at a position corresponding to the right angle 43D, such that distribution of electric field near that position is more uniform, thus avoiding point discharge, effectively reducing electric field at corner of the gate, and increasing breakdown voltage of the device.

Also, with the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

Embodiment 3

Figure 6:
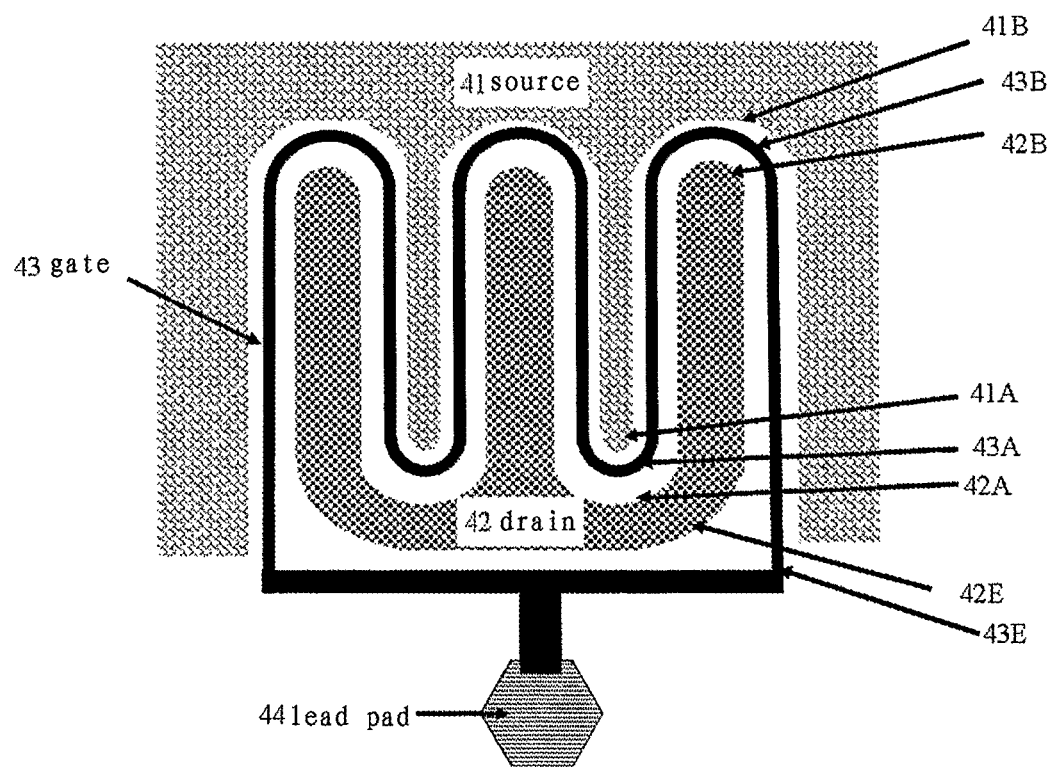
FIG. 6 depicts a layout structure of a semiconductor device according to another embodiment of the invention.

FIG. 6 depicts a layout structure of a semiconductor device according to another embodiment of the invention.

As shown in FIG. 6, this embodiment is the same as the embodiment 2 shown in the above FIG. 5 in that, the source 41 and the drain 42 comprise intersected multiple fingers 41A, 42B, and the gate 43 is located between the source 41 and the drain 42, and forms a closed ring structure encircling the multiple fingers 41A of the source 41 and the multiple fingers 42B of the drain 42, and starting point and ending point of the gate 43 are not directly connected, rather, they are connected through an interconnection line. Description of portions of embodiment 3 that are same as that of embodiment 2 will be omitted herein, and emphasis will be put on difference of the two.

Embodiment 3 differs from embodiment 2 in that the gate 43 entirely encircles the drain 42, and the source 41 is located at peripheral of the gate 43.

In this embodiment, a sharp right angle 43E is formed at the corner where the gate 43 is connected to the interconnection line, as shown in FIG. 6. To reduce electric field near the right angle 43E, an arc structure is employed at position 42E of the drain 42 corresponding to the right angle 43E, such that distribution of electric field near that position is more uniform, thus avoiding point discharge, effectively reducing electric field at corner of the gate, and increasing breakdown voltage of the device.

Also, with the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

Embodiment 4

Figure 7:
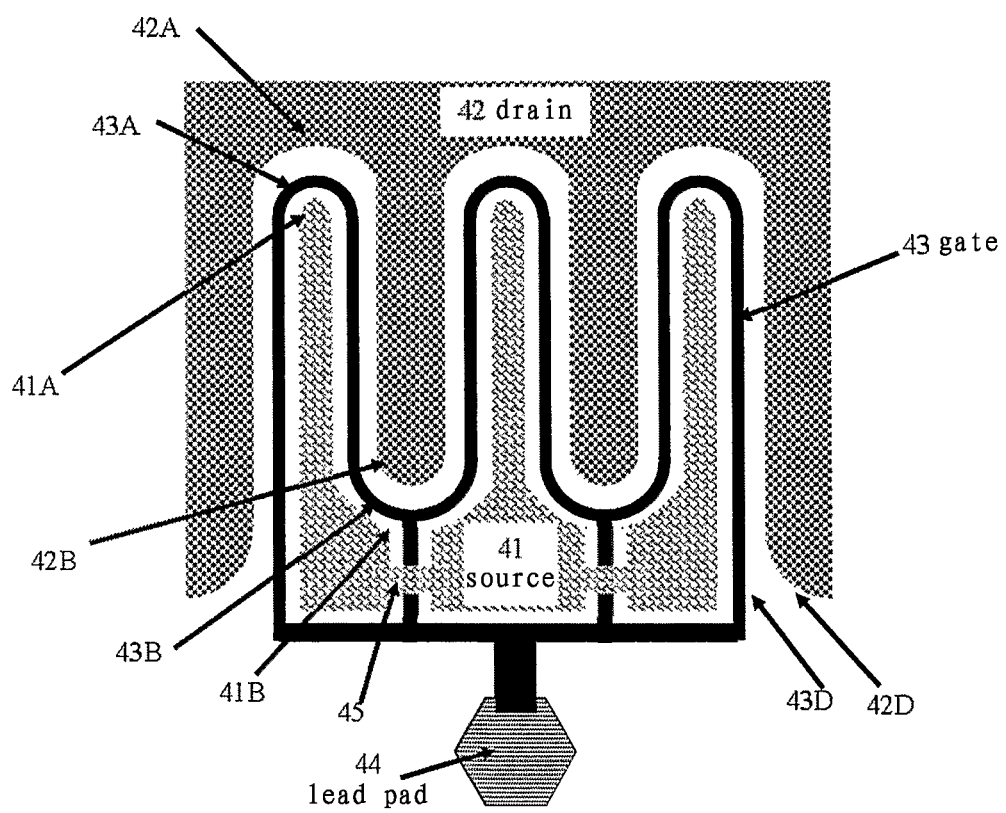
FIG. 7 depicts a layout structure of a semiconductor device according to another embodiment of the invention.

FIG. 7 depicts a layout structure of a semiconductor device according to another embodiment of the invention.

As shown in FIG. 7, this embodiment is the same as the embodiment 2 shown in the above FIG. 5 in that, the source 41 and the drain 42 comprise intersected multiple fingers 41A, 42B, and the gate 43 is located between the source 41 and the drain 42, and forms a closed ring structure encircling the multiple fingers 41A of the source 41 and the multiple fingers 42B of the drain 42, and starting point and ending point of the gate 43 are not directly connected, rather, they are connected through an interconnection line. Description of portions of embodiment 4 that are same as that of embodiment 2 will be omitted herein, and emphasis will be put on difference of the two.

Embodiment 4 differs from embodiment 2 in that an interconnection line is leaded from corner 43B of the gate 43 with closed ring structure to be connected to a lead pad 44 of the gate 43. Such a design may help to reduce resistance of the gate 43 while reducing phase difference of signals between respective fingers 43A of the gate 43. In this embodiment, the source 41 needs an interconnection line across the gate 43 via an air bridge 45 to realize interconnection.

In addition, although in this embodiment, the gate 43 entirely encircles the source 41, it is also possible to, like FIG. 6, make the gate 43 entirely encircle the drain 42 and make the source 41 locate at peripheral of the gate 43. Here, to reduce electric field near the right angle 43D, what is needed is to, like FIG. 6, employ an arc structure at a position of the drain 42 corresponding to the right angle 43D, such that distribution of electric field near that position is more uniform, thus avoiding point discharge, effectively reducing electric field at corner of the gate, and increasing breakdown voltage of the device.

Also, with the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

Embodiment 5

Figure 8:
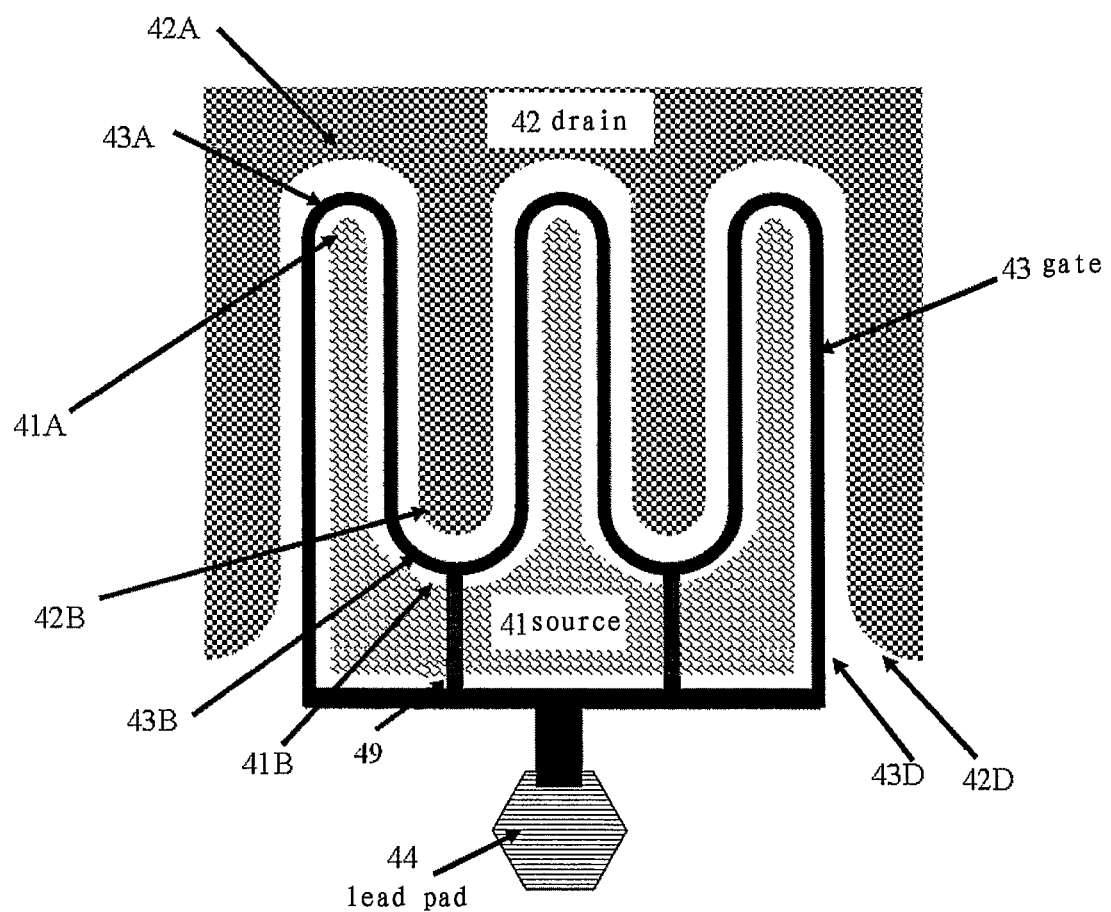
FIG. 8 depicts a layout structure of a semiconductor device according to another embodiment of the invention.

FIG. 8 depicts a layout structure of a semiconductor device according to another embodiment of the invention.

As shown in FIG. 8, this embodiment is the same as the embodiment 2 shown in the above FIG. 5 in that, the source 41 and the drain 42 comprise intersected multiple fingers 41A, 42B, and the gate 43 is located between the source 41 and the drain 42, and forms a closed ring structure encircling the multiple fingers 41A of the source 41 and the multiple fingers 42B of the drain 42, and starting point and ending point of the gate 43 are not directly connected, rather, they are connected through an interconnection line. Description of portions of embodiment 5 that are same as that of embodiment 2 will be omitted herein, and emphasis will be put on difference of the two.

Embodiment 5 differs from embodiment 2 in that, corner 43B of the gate 43 with closed ring structure is connected to a lead pad 44 of the gate 43 across the source 41 via an air bridge 49. Such a design may help to reduce resistance of the gate 43 while reducing phase difference of signals between respective fingers 43A of the gate 43.

In addition, although in this embodiment, the gate 43 entirely encircles the source 41, it is also possible to, like FIG. 6, make the gate 43 entirely encircle the drain 42 and make the source 41 locate at peripheral of the gate 43. Here, to reduce electric field near the right angle 43D, what is needed is to, like FIG. 6, employ an arc structure at a position of the drain 42 corresponding to the right angle 43D, such that distribution of electric field near that position is more uniform, thus avoiding point discharge, effectively reducing electric field at corner of the gate, and increasing breakdown voltage of the device.

Also, with the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

Embodiment 6

Figure 9:
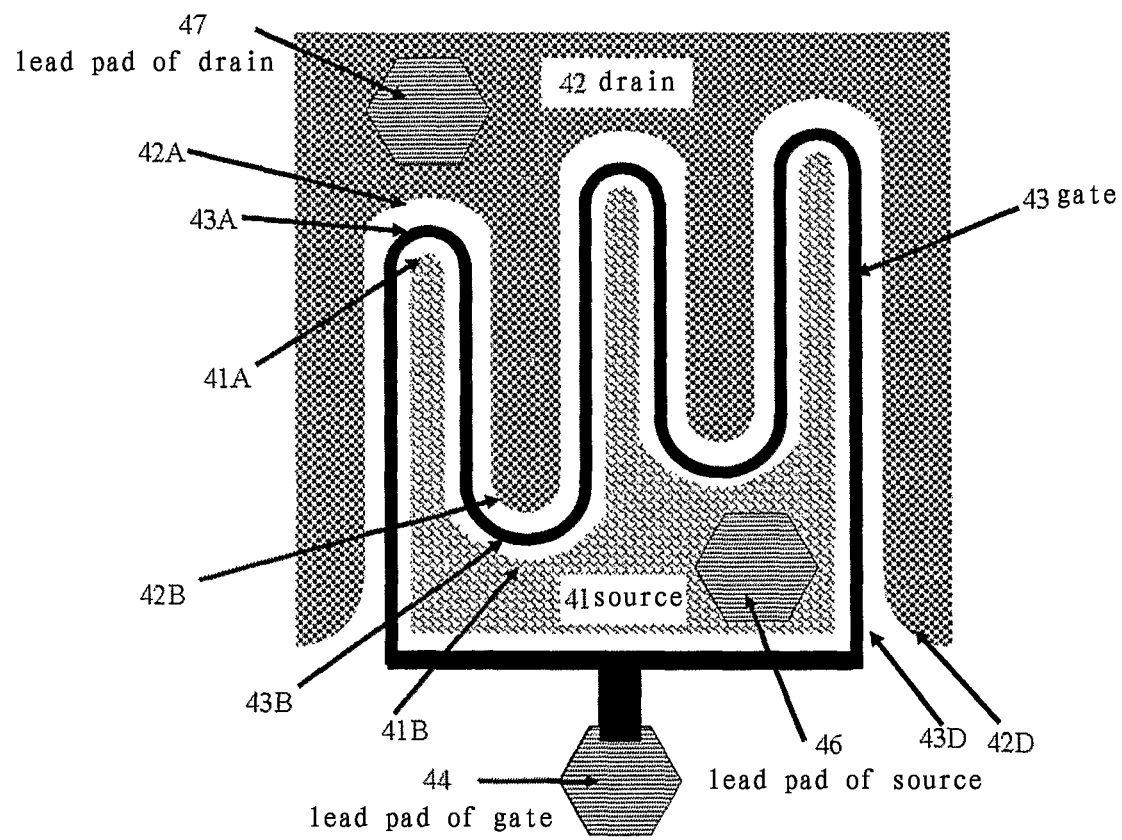
FIG. 9 depicts a layout structure of a semiconductor device according to another embodiment of the invention.

FIG. 9 depicts a layout structure of a semiconductor device according to another embodiment of the invention.

As shown in FIG. 9, this embodiment is the same as the embodiment 2 shown in the above FIG. 5 in that, the source 41 and the drain 42 comprise intersected multiple fingers 41A, 42B, and the gate 43 is located between the source 41 and the drain 42, and forms a closed ring structure encircling the multiple fingers 41A of the source 41 and the multiple fingers 42B of the drain 42, and starting point and ending point of the gate 43 are not directly connected, rather, they are connected through an interconnection line. Description of portions of embodiment 6 that are same as that of embodiment 2 will be omitted herein, and emphasis will be put on difference of the two.

Embodiment 6 differs from embodiment 2 in that, width of respective fingers 41A, 42B of the source 41 and the drain 42 are different, such a layout may help to leave larger space in certain regions of the source 41 and the drain 42, and to facilitate allocation and wiring of lead pad 46 of the source and lead pad 47 of the drain. Therefore, there is no need to place lead pad in regions outside of the source and drain and to lead an interconnection line or an air bridge from the source 41 and the drain 42 to be connected to the lead pad. Thus, space on a wafer may be saved and production cost may be reduced.

Preferably, in this embodiment, lead pad 46 of the source 41 and lead pad 44 of the gate 43 are disposed at one side of the layout, and lead pad 47 of the drain 42 is disposed at the other side, such that damage to device due to the high voltage between the gate and drain may be avoided. This is because a very high voltage difference (probably over one thousand volts) exists between the gate and drain, and between the source and drain, while voltage difference between the source and the gate is relatively small. If the gate and the drain are at the same side, the high voltage between the gate and drain may cause device degradation or device breakdown.

It should be appreciated that, although in this embodiment, lead pads of the source 41 and gate 43 and lead pad of the drain 42 are disposed at different sides, such a structure may also be employed in embodiments 1-5 corresponding to the above FIGS. 3A, 5-8, so as to avoid device damage due to the high voltage between the gate and drain.

In addition, although in this embodiment, the gate 43 entirely encircles the source 41, it is also possible to, like FIG. 6, make the gate 43 entirely encircle the drain 42 and make the source 41 locate at peripheral of the gate 43. Here, to reduce electric field near the right angle 43D, what is needed is to, like FIG. 6, employ an arc structure at a position of the drain 42 corresponding to the right angle 43D, such that distribution of electric field near that position is more uniform, thus avoiding point discharge, effectively reducing electric field at corner of the gate, and increasing breakdown voltage of the device.

Also, with the above semiconductor device of the present embodiment, since the source 41 and the drain 42 comprise intersected multiple fingers 41A, 42B, that is, the source and the drain are embedded with each other, the gate 43 is located between the source 41 and the drain 42 and encircles the multiple fingers 41A, 42B of the source 41 and the drain 42, total width of the gate 43 within unit area may be significantly increased. Because current density of the device is not affected by layout design, when total gate width within unit area increases significantly, maximum saturation current within unit area will also increase significantly. Also, since the gate 43 comprises a closed ring structure without beginning and ending, making the gate no starting point and ending point, the phenomenon of point discharge may be effectively avoided, which increases breakdown voltage of the device. In addition, by forming the source 41 and the drain 42 into embedded structure intersected with each other, area on a wafer may be effectively utilized, thereby reducing production cost.

Embodiment 7

The present embodiment relates to a fabrication method of the semiconductor devices of the above embodiments 1-6.

In this embodiment, first, a semiconductor layer is deposited on a substrate by using a deposition method known by those skilled in the art, such as CVD, VPE, MOCVD, LPCVD, PECVD, Pulse Laser Deposition (PLD), Atom Layer Extension, MBE, sputtering, evaporation etc, the substrate may be Sapphire, SiC, GaN, Si or any other substrate known in the art suitable for growing GaN material, and the invention has no limitation to this.

Alternatively, an optional nucleation layer may be deposited on the substrate by using the above deposition methods before depositing the semiconductor layer.

The deposited semiconductor layer may be any semiconductor material that is based on nitride, such as group-III nitride semiconductor material, wherein group-III atom comprises Indium, Aluminum, Gallium or combinations thereof. In particular, the semiconductor layer may comprise Gallium Nitride (GaN) and other Ga-type compound semiconductor material such as AlGaN, InGaN etc, or may be a bonded stack of Ga-type compound semiconductor material with other semiconductor material. Polarity of Ga-type semiconductor material may be Ga-face, or may be N-face, non-polarity or semi-polarity.

Next, an isolation layer is deposited on the semiconductor layer by using the above deposition methods, the isolation layer may be any semiconductor material that is capable of forming heterojunction with underlying semiconductor layer, including Ga-type compound semiconductor material or group-III nitride semiconductor material, such as $In_xAl_yGa_zN_{1-x-y-z}$ ($0 \leq x, y, z \leq 1$). That is to say, the invention has no limitation on the deposited semiconductor layer and isolation layer, as long as the two can form heterojunction therebetween. Since semiconductor hetero-junction is formed between the semiconductor layer and the isolation layer, polarized charge at the interface of the heterojunction introduces two-dimensional electron gas (2DEG) with high electron concentration. Meanwhile, since ionized impurity scattering is greatly reduced, electrons have very high electron mobility.

Next, alternatively, an optional dielectric layer is deposited on the isolation layer by using the above deposition methods, the dielectric layer may be one or more layers of dielectric layer. The dielectric layer may be crystal material deposited during growth or process procedure, such as GaN or AlN etc; or may be amorphous material deposited during growth or process procedure, such as $Si_xN_y$ or $SiO_2$ etc. The dielectric layer may help to reduce current dispersion effect of GaN HEMT.

Next, a source and a drain which are in contact with the semiconductor layer are formed by using any methods known to those skilled in the art, such as high temperature anneal, ion implantation, heavy doping etc.

Next, a gate is formed on the isolation layer and between the source and the drain by using the above deposition methods.

During the process of forming the source, drain and gate, the layout structure as shown in FIGS. 3A, 5-8 are formed by using masking methods known to those skilled in the art, so that the semiconductor devices as described in the above embodiments 1-6 may be obtained.

In addition, the gate may also be formed as a two-layer gate structure, for example, first a dielectric layer (e.g. $SiO_2$) is formed, and then gate metal is formed on the dielectric layer. Alternatively, in the present embodiment, a field plate structure and a floating gate structure may also be formed during the process of forming the gate, details of which may be found in patent documents 1-3, the description of which will be omitted here.

With the method of forming a semiconductor device of the present embodiment, all the advantages described in the above embodiments 1-6 may be achieved.

It should be appreciated that, the present invention increases breakdown voltage of a semiconductor device from the perspective of layout design, therefore, the depletion mode GaN HEMT described in the above embodiments 1-7 is just an example, the invention is not limited thereto. The invention is both applicable to GaN HEMT operating at a high voltage and large current environment, or applicable to transistor of other forms, such as MOSFET, MISFET, DHFET, JFET, MESFET, MISHFET or other field effect transistors. Furthermore, these devices may be enhancement mode or depletion mode.

Although a semiconductor device and a method for fabricating the semiconductor device of the invention have been described through some exemplary embodiments, these embodiments are not exhaustive, various changes and modification may be made by those skilled in the art within the spirit and scope of the invention. Therefore, the invention is not limited to these embodiments, the scope of which is only defined by appending claims.

The invention claimed is:

1. A semiconductor device, comprising:
a semiconductor layer on a substrate;
an isolation layer on the semiconductor layer;
a source and a drain which are in contact with the semiconductor layer, each of the source and the drain comprises multiple fingers, and the multiple fingers of the source intersect the multiple fingers of the drain; and
a gate on the isolation layer, the gate is located between the source and the drain and comprises a closed ring structure which encircles the multiple fingers of the source and the drain;
wherein the semiconductor layer and the isolation layer comprise group-III nitride semiconductor material;
wherein a head and tail of the gate are connected through an interconnection line; and
wherein portions of the drain that correspond to connection portions of the gate and the interconnection line employ an arc structure.

2. The semiconductor device according to claim 1, wherein, respective corners of the gate employ an arc structure, and portions of the source and the drain that correspond to the respective corners also employ an arc structure.

3. The semiconductor device according to claim 1, wherein, the closed ring structure completely encircles one of the source and the drain.

4. The semiconductor device according to claim 3, wherein, the other of the source and the drain is located at peripheral of the gate.

5. The semiconductor device according to claim 1, wherein, tips of the multiple fingers of the source and the drain employ an arc structure, and portions of the gate that correspond to the arc structure of the tips of the multiple fingers also employ an arc structure.

6. The semiconductor device according to claim 1, further comprising a dielectric layer on the isolation layer between the source and the drain.

7. The semiconductor device according to claim 1, further comprising a field plate structure and/or a floating gate structure.

8. The semiconductor device according to claim 1, wherein group-III atom of the group-III nitride semiconductor material comprises Indium, Aluminum, Gallium or combinations thereof.

9. The semiconductor device according to claim 1, wherein, the gate is connected to a lead pad of the gate via an air bridge across the source or the drain, or is connected to a lead pad of the gate via an interconnection line.

10. The semiconductor device according to claim 1, wherein, lead pads of the source and the gate are located at one side, and a lead pad of the drain is located at the other side.

11. The semiconductor device according to claim 1, wherein, width of the multiple fingers of the source and the drain are different.

12. The semiconductor device according to claim 1, wherein, a corner of the gate is connected to a lead pad of the gate through an interconnection line or an air bridge.

13. A method for fabricating a semiconductor device, comprising steps of:
    depositing a semiconductor layer on a substrate;
    depositing an isolation layer on the semiconductor layer;
    forming a source and a drain which are in contact with the semiconductor layer, each of the source and the drain comprises multiple fingers, and the multiple fingers of the source intersect the multiple fingers of the drain; and
    forming a gate on the isolation layer, the gate is located between the source and the drain and comprises a closed ring structure which encircles the multiple fingers of the source and the drain;
    wherein the semiconductor layer and the isolation layer comprise group-III nitride semiconductor material;
    wherein a head and tail of the gate are connected through an interconnection line; and
    wherein portions of the drain that correspond to connection portions of the gate and the interconnection line employ an arc structure.

14. The method according to claim 13, wherein, respective corners of the gate employ an arc structure, and portions of the source and the drain that correspond to the respective corners also employ an arc structure.

15. The method according to claim 13, wherein, tips of the multiple fingers of the source and the drain are formed as an arc structure, and portions of the gate that correspond to the arc structure of the tips of the multiple fingers are also formed as an arc structure.

16. The method according to claim 13, wherein, lead pads of the source and the gate are formed at one side, and a lead pad of the drain is formed at the other side.

17. The method according to claim 13, wherein, the multiple fingers of the source and the drain are formed into different width.

18. The method according to claim 13, wherein, a corner of the gate is connected to a lead pad of the gate through an interconnection line or an air bridge.

19. A semiconductor device, comprising:
    a semiconductor layer on a substrate;
    an isolation layer on the semiconductor layer;
    a source and a drain which are in contact with the semiconductor layer, each of the source and the drain comprises multiple fingers, and the multiple fingers of the source intersect the multiple fingers of the drain; and
    a gate on the isolation layer, the gate is located between the source and the drain and comprises a closed ring structure which encircles the multiple fingers of the source and the drain;
    wherein the semiconductor layer and the isolation layer comprise group-III nitride semiconductor material; and
    wherein width of the multiple fingers of the source and the drain are different.

* * * * *